(12) United States Patent
Cheng et al.

(10) Patent No.: US 9,519,007 B2
(45) Date of Patent: Dec. 13, 2016

(54) HANDLING SYSTEM FOR TESTING ELECTRONIC COMPONENTS

(71) Applicants: Chi Wah Cheng, Hong Kong (HK); Wang Lung Tse, Hong Kong (HK); Chi Kit Cheung, Hong Kong (HK); Cho Tao Cheung, Hong Kong (HK)

(72) Inventors: Chi Wah Cheng, Hong Kong (HK); Wang Lung Tse, Hong Kong (HK); Chi Kit Cheung, Hong Kong (HK); Cho Tao Cheung, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 429 days.

(21) Appl. No.: 13/753,706

(22) Filed: Jan. 30, 2013

(65) Prior Publication Data

US 2013/0207679 A1 Aug. 15, 2013

Related U.S. Application Data

(60) Provisional application No. 61/597,333, filed on Feb. 10, 2012.

(51) Int. Cl.
*G01R 31/01* (2006.01)
*G01R 1/02* (2006.01)
*G01R 31/28* (2006.01)

(52) U.S. Cl.
CPC ............... *G01R 1/02* (2013.01); *G01R 31/01* (2013.01); *G01R 31/2891* (2013.01); *G01R 31/2893* (2013.01)

(58) Field of Classification Search
USPC .... 324/750.13, 757.01, 762.01, 756.02, 537, 324/750.03, 750.06, 750.19, 757.04, 324/759.03, 703, 762.02; 414/222.13, 414/222.04, 222.07, 226.05; 165/61
See application file for complete search history.

(56) References Cited

U.S. PATENT DOCUMENTS

| | | | |
|---|---|---|---|
| 6,515,470 B2* | 2/2003 | Suzuki | B65G 57/04 324/750.03 |
| 6,879,869 B2* | 4/2005 | Kou | 700/117 |
| 2005/0134256 A1* | 6/2005 | Cheng et al. | 324/158.1 |
| 2006/0070849 A1* | 4/2006 | Sze | B65G 47/252 198/403 |
| 2007/0152655 A1* | 7/2007 | Ham | G01R 31/2893 324/750.13 |
| 2008/0290004 A1* | 11/2008 | Tsai et al. | 209/573 |
| 2009/0129899 A1* | 5/2009 | Cheng | H01L 21/67271 414/225.01 |

(Continued)

*Primary Examiner* — Melissa Koval
*Assistant Examiner* — Nasima Monsur
(74) *Attorney, Agent, or Firm* — Ostrolenk Faber LLP

(57) ABSTRACT

A handling system for testing electronic components comprises a rotary turret and pick heads mounted on the rotary turret, each pick head being configured to hold a respective electronic component provided by a supply source. A carrier system which is positionable adjacent to the rotary turret is configured to carry a plurality of electronic components. The carrier system is receivable by a testing station that is operative to simultaneously test a plurality of the electronic components which have been arranged on the carrier system. The pick heads or other transfer mechanism may transfer the electronic components onto the carrier system prior to testing the same at the testing station and remove electronic components from the carrier system after testing the same at the testing station.

19 Claims, 3 Drawing Sheets

(56) References Cited

U.S. PATENT DOCUMENTS

2010/0209219 A1\* 8/2010 Sze ........................ G01R 31/01
                                                                                             414/222.02
2010/0310343 A1\* 12/2010 Mayer .................... G01D 18/00
                                                                                             414/222.07

\* cited by examiner

HANDLING SYSTEM FOR TESTING ELECTRONIC COMPONENTS

FIELD OF THE INVENTION

The invention relates to an apparatus for processing and testing devices in a test handler.

BACKGROUND AND PRIOR ART

Typically, there are two types of test handlers used for testing electrical components. One type of test handler comprises a turret test handler for handling singulated electronic components with small sizes and very short test times under room temperature conditions. Another type of test handler comprises a matrix test handler for handling an array of electronic components that may be arranged on strips, ultraviolet tapes or carriers. These electronic components typically require long test times and testing may be conducted in a wide range of temperature conditions.

Where the electronic components require long test times during testing, there is generally no advantage in using a turret test handler since the testing turnover would be relatively slow when consecutively testing individual electronic components. Furthermore, testing is limited to room temperature conditions only. On the other hand, when using a matrix test handler, there can only be a limited number of parallel test sites due to tape expansion. Furthermore, there are high costs incurred both for investing in the matrix test handler and for operating the matrix test handler to test electronic components with relatively long test times. For example, where electronic components are mounted on ultraviolet tapes for matrix testing, the ultraviolet tapes are expensive and will contribute to increased operation costs.

SUMMARY OF THE INVENTION

It is thus an object of the invention to seek to devise an apparatus and method for processing and testing electronic components which is capable of testing electronic components in environments which involve a combination of long test times as well as non-room temperature conditions to avoid the aforesaid shortcomings of the prior art.

According to a first aspect of the invention, there is provided a handling system for testing electronic components, comprising: a rotary turret; pick heads mounted on the rotary turret, each pick head being configured to hold a respective electronic component provided by a supply source; a carrier system which is positionable adjacent to the rotary turret and which is configured to carry a plurality of electronic components; and a testing station which is configured for receiving the carrier system and which is operative to simultaneously test a plurality of the electronic components which have been arranged on the carrier system; wherein the pick heads are operative to transfer the electronic components onto the carrier system prior to testing the same at the testing station and to remove electronic components from the carrier system after testing the same at the testing station.

According to a second aspect of the invention, there is provided a handling system for testing electronic components, comprising: an onloading station; a carrier system which is positionable next to the onloading station, the carrier system being configured to carry a plurality of electronic components transferred from the onloading station to the carrier system; a testing station which is configured for receiving the carrier system and which is operative to simultaneously test a plurality of the electronic components which have been arranged on the carrier system; a rotary turret; and pick heads mounted on the rotary turret, each pick head being configured to hold a respective electronic component provided by the carrier system; wherein the pick heads are operative to remove electronic components from the carrier system after testing the same at the testing station.

According to a third aspect of the invention, there is provided a method for testing electronic components, comprising the steps of: providing electronic components from a supply source to pick heads mounted on a rotary turret, each pick head being configured to hold a respective electronic component; transferring a plurality of electronic components from the pick heads to a carrier system positioned adjacent to the rotary turret; moving the carrier system to a testing station for simultaneously testing a plurality of the electronic components which have been arranged on the carrier system; and after testing the electronic components, removing the plurality of electronic components from the carrier system with the pick heads.

It would be convenient hereinafter to describe the invention in greater detail by reference to the accompanying drawings which illustrate certain preferred embodiments of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of the preferred embodiments of the invention when considered with the accompanying drawings, in which.

DETAILED DESCRIPTION OF THE PREFERRED EMBODIMENTS OF THE INVENTION

Figure 1:
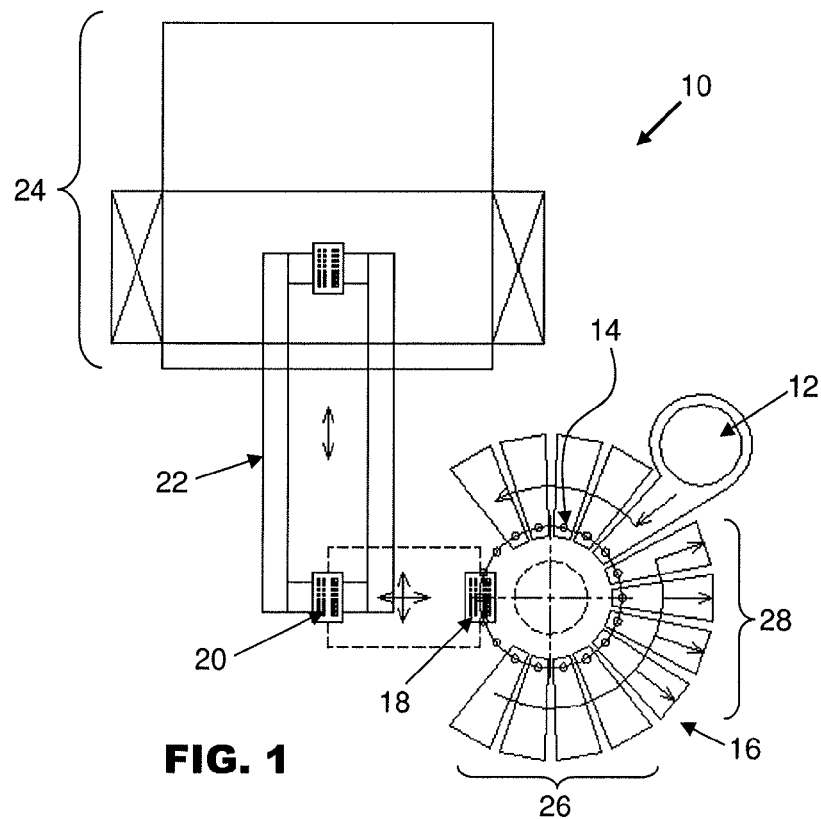
FIG. 1 is a plan view of an apparatus according to a first preferred embodiment of the invention.

FIG. 1 is a plan view of an apparatus 10 according to a first preferred embodiment of the invention. Electronic components are onloaded from a supply source such as a bowl feeder 12 to pick heads 14 which are mounted on a rotary turret 16. Each pick head 14 is configured to hold a respective electronic component provided by the bowl feeder 12. The turret 16 then rotates to transport the electronic components held by the pick heads 14. The electronic components are then transported towards a buffer system, which may comprise a first buffer carrier 18 and a second buffer carrier 20. The buffer carriers may be in the form of trays or platforms. The electronic components are subsequently transferred from the pick heads 14 onto the first buffer carrier 18 in an array format that is suitable for subsequent testing operations.

The first buffer carrier 18 carrying the electronic components in array format is held and conveyed by a conveying mechanism, which may be in the form of linear arms 22, linearly from the position of the turret 16 towards the position of a testing station 24 for parallel testing. Contemporaneously, the second buffer carrier 20 which is empty is conveyed linearly to the turret 16 by the linear arms 22 to receive new electronic components which are then transferred onto the second buffer carrier 20 from the pick heads 14 in an array format.

The testing station 24 is configured to receive the first buffer carrier 18 and simultaneously tests a plurality of electronic components which have been arranged on the first buffer carrier 18 at one time. Preferably, all the electronic components arranged on the first buffer carrier 18 may be tested at the same time. The second buffer carrier 20, now carrying the electronic components in array format, moves to the testing station 24 to stand by. It will proceed for parallel testing after the first buffer carrier 18 has completed the testing process for the electronic components arranged on it.

Thereafter, the first buffer carrier 18 moves back to the turret 16 to offload the electronic components to the pick heads 14 of the turret 16. The pick heads 14 are operative at this stage to remove the electronic components from the first buffer carrier 18. The removed electronic components on the turret 16 will go through the subsequent processes at various stations connected to the turret 16. For example, there may be an inspection station 26 to visually inspect the electronic components while they are being held by the pick heads 14, and an offloading station 28 adjacent to the turret 16 to which the pick heads 14 transfer the electronic components. At the offloading station 28, the electronic components are transferred to tapes or sorted into bins according to the inspection or other processing results.

The cycle of the above steps is repeated until all electronic components contained in the bowl feeder 12 are consumed in the above processing steps and offloaded at the offloading station 28. Thus, the process as described above allows individual electronic components to be introduced to the apparatus 10, and the electronic components may then be handled in array form during testing where relatively long test times are required. After testing, the electronic components may again be handled individually at the turret 16.

Figure 2:
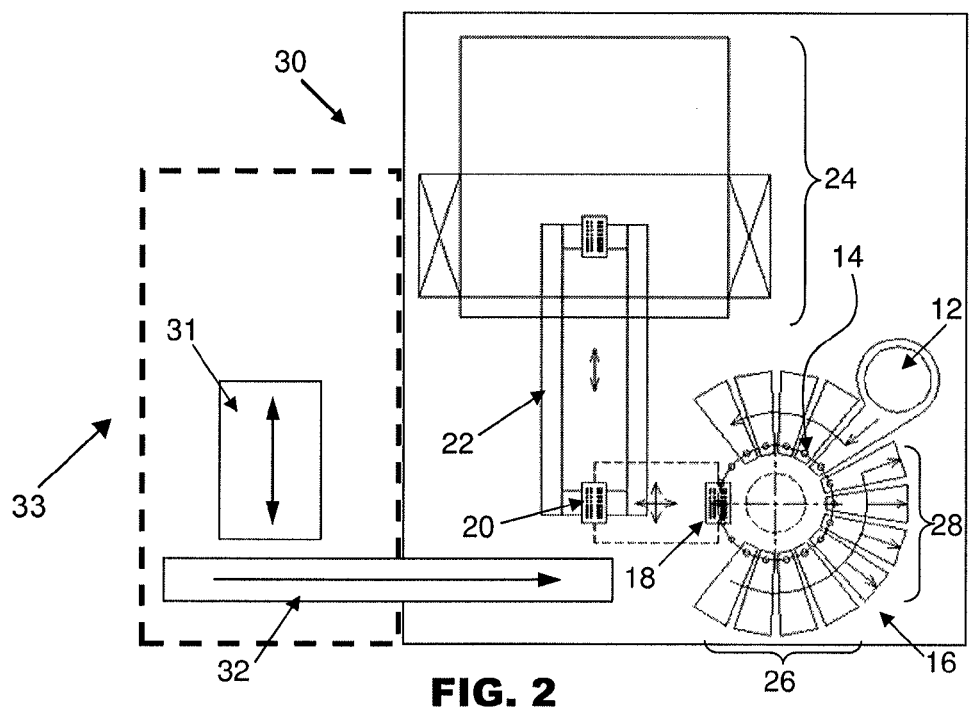
FIG. 2 is a plan view of an apparatus according to a second preferred embodiment of the invention.

FIG. 2 is a plan view of an apparatus 30 according to a second preferred embodiment of the invention. The main variation from the first embodiment of the invention is that the electronic components may be onloaded at an onloading station 33 where a tray 31 containing electronic components arranged in array format may be located for transferring electronic components directly onto the buffer carriers 18, 20 by means of a loading arm 32. After the testing carried out at the testing station 24 as in the first embodiment of the invention, the electronic components undergo further processing at the turret 16, such as for inspection at an inspection station 26 and for offloading at an offloading station 28.

Figure 3:
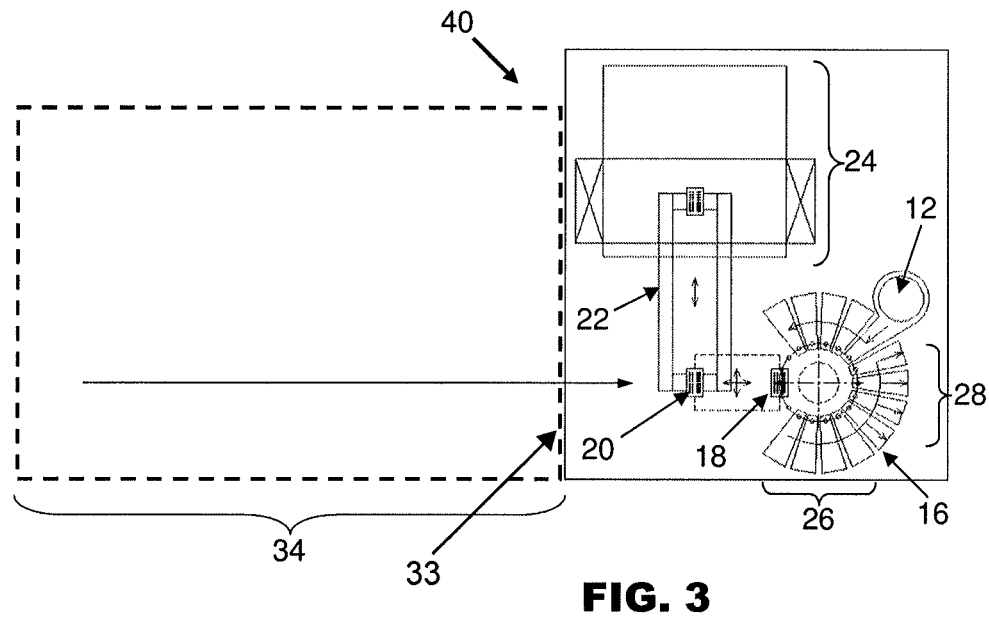
FIG. 3 is a plan view of an apparatus according to a third preferred embodiment of the invention.

FIG. 3 is a plan view of an apparatus 40 according to a third preferred embodiment of the invention. In this embodiment, a saw singulation system 34 is connected to the onloading station 33 adjacent to the first and second buffer carriers 18, 20, and electronic components that have undergone singulation are onloaded from the saw singulation system 34 directly to the buffer carriers 18, 20. Thereafter, the electronic components go through testing at the testing station 24, inspection at the inspection station 26 and offloading at the offloading station 28 as in the previous embodiments.

Figure 4:
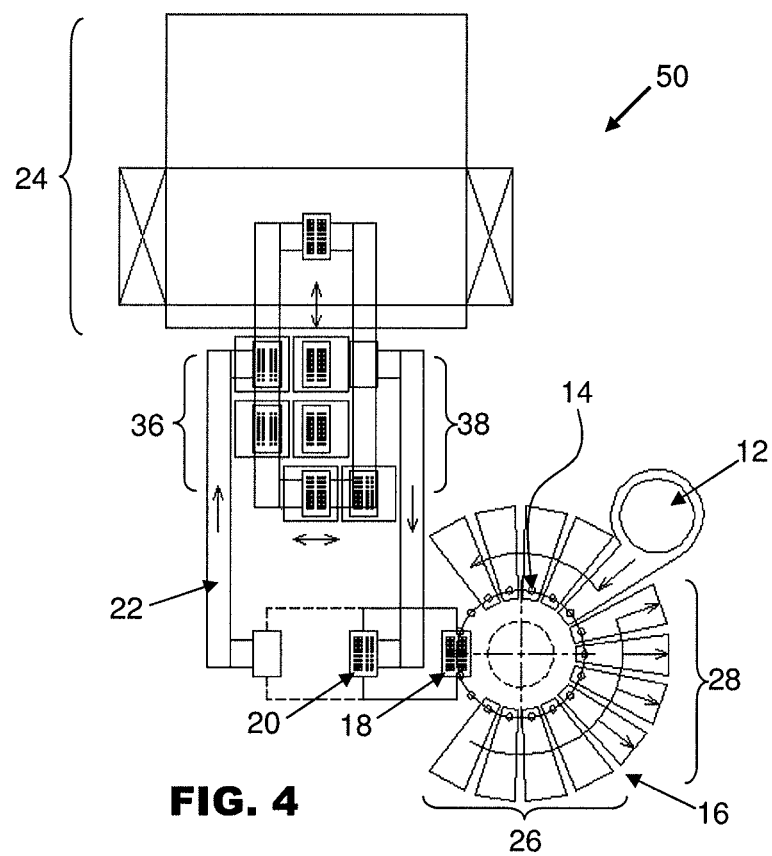
FIG. 4 is a plan view of an apparatus according to a fourth preferred embodiment of the invention.

FIG. 4 is a plan view of an apparatus 50 according to a fourth preferred embodiment of the invention. The apparatus 50 is similar to the apparatus 10 according to the first embodiment, but includes a temperature control zone, which may comprise a separate heating or cooling zone 36. The heating or cooling zone 36 allows heating or cooling of electronic components to take place to bring the electronic components to a desired temperature prior to testing at the testing station 24.

The heating or cooling zone is normally implemented by means of a heating and/or cooling chamber, or a hot plate. A heating or cooling chamber is normally a closed environment that adjusts a temperature of the electronic components located therein according to a predetermined temperature control loop. A thermal sensor is used to detect the temperature inside the chamber, so as to control the power or intensity level of the heating or cooling agent (such as liquid Nitrogen) that is used.

A hot plate comprises a flat plate (wafer) or carrier (singulated devices), which is not in chamber form and is normally not an enclosed environment. The thermal sensor is located on the hot plate, preferably close to the surface contacting the devices, which can be used to monitor and control the power level of the heater.

Soaking time is required for the device to become thermally stable before testing. As the chamber is a closed environment, the temperature is normally better-controlled, whereas a hot plate normally exposes the electronic components to an ambient environment, which may affect their thermal condition.

Furthermore, after testing, the electronic components may be moved to an adjacent re-ambience zone 38 comprised in the temperature control zone (which may comprise a cooling zone to lower the temperature of the electronic components or a heating zone to elevate the temperature of the electronic components), which is operative to further cool or heat the electronic components. This allows the temperature of the electronic components to be adjusted back to an ambient temperature after testing at the testing station 24.

Figure 5:
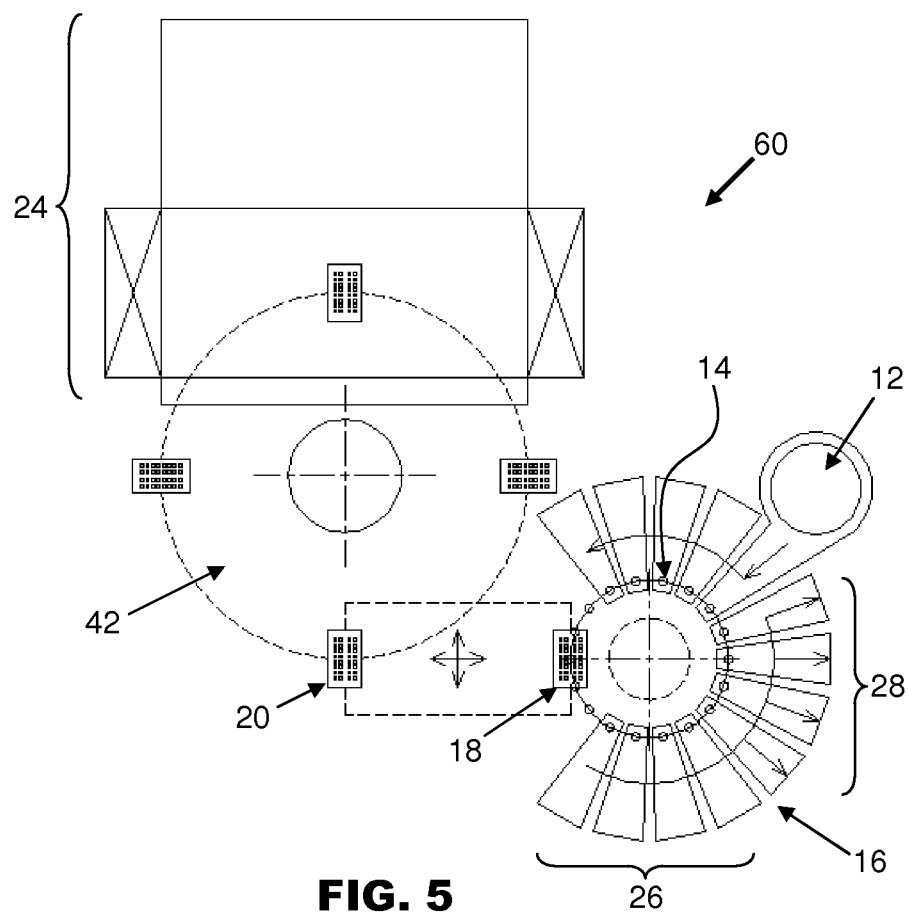
FIG. 5 is a plan view of an apparatus according to a fifth preferred embodiment of the invention.

FIG. 5 is a plan view of an apparatus 60 according to a fifth preferred embodiment of the invention. Instead of linear arms 22, this apparatus 60 includes a conveying mechanism in the form of a rotary arm 42 which is configured to hold a plurality of buffer carriers 18, 20, convey the buffer carriers to the testing station 24, and then convey them back to the turret 16. The rotary arm 42 is capable of carrying at least two and preferably four buffer carriers 18, 20 simultaneously, such that the plurality of buffer carriers 18, 20 are equally-spaced around the rotary arm 42. In the latter arrangement, the four buffer carriers may be arranged orthogonally with respect to one another.

It should be appreciated that the apparatus according to the preferred embodiments of the invention offer high throughput and reduced cost for processing electronic components requiring relatively long test times. There is also room for integrating different functional modules, such as an onloading station 33 including trays 31 and/or connected to saw singulation systems 34, into the apparatus.

The invention described herein is susceptible to variations, modifications and/or additions other than those specifically described and it is to be understood that the invention includes all such variations, modifications and/or additions which fall within the spirit and scope of the above description.

The invention claimed is:

1. A handling system for testing electronic components, comprising:

a rotary turret;
pick heads mounted on the rotary turret, each pick head being configured to hold a respective electronic component provided by a supply source;
a carrier system which is positionable adjacent to the rotary turret and which is configured to carry electronic components, wherein the carrier system comprises a first buffer carrier for carrying a first array of a first plurality of electronic components and a second buffer carrier for carrying a second array of a second plurality of electronic components; and
a testing station which is configured for receiving the carrier system;
and is configured to simultaneously test the first array of the first plurality of electronic components which have been arranged on the first buffer carrier of the carrier system while the second buffer carrier stands by at the testing station, the second buffer carrier proceeding for testing of the second array of the second plurality of electronic components at the testing station after the testing station completes testing of the first array of the first plurality of electronic components on the first buffer carrier;
wherein the pick heads are operative to transfer the electronic components onto the first buffer carrier and the second buffer carrier prior to testing the same at the testing station and to remove electronic components from the first buffer carrier and the second buffer carrier after testing the same at the testing station;
wherein the first array of the first plurality of electronic components are held by a first plurality of pick heads and the second array of the second plurality of electronic components are held by a second plurality of pick heads;
wherein each of the first buffer carrier and the second buffer carrier is movable from a position of the rotary turret to a position of the testing station; and
wherein each of the first buffer carrier and the second buffer carrier is movable at the same time from the position of the rotary turret to the position of the testing station.

2. The handling system as claimed in claim 1, further comprising a conveying mechanism for conveying the carrier system between positions of the rotary turret and the testing station.

3. The handling system as claimed in claim 2, wherein the conveying mechanism comprises one or more linear arms operative to hold and convey the carrier system between the rotary turret and the testing station linearly.

4. The handling system as claimed in claim 2, wherein the conveying mechanism comprises a rotary arm which is configured to hold and convey the carrier system between the rotary turret and the testing station.

5. The handling system as claimed in claim 4, wherein the rotary arm is configured to simultaneously hold and convey a plurality of buffer carriers comprised in the carrier system, such that the plurality of buffer carriers are equally spaced around the rotary arm.

6. The handling system as claimed in claim 1, further comprising an offloading station located adjacent to the rotary turret to which the pick heads transfer the electronic components which have been removed from the carrier system.

7. The handling system as claimed in claim 1, wherein the first plurality of electronic components arranged on the first buffer carrier are tested at the testing station while electronic components are transferred by the pick heads to the second buffer carrier adjacent to the rotary turret.

8. The handling system as claimed in claim 1, further comprising an inspection station operative to visually inspect the electronic components while they are being held by the pick heads.

9. The handling system as claimed in claim 1, further comprising a temperature control zone through which the carrier system is conveyed, the temperature control zone being operative to bring the electronic components to a desired temperature prior to testing the electronic components at the testing station.

10. The handling system as claimed in claim 9, wherein the temperature control zone further comprises a heating zone and a separate cooling zone adjacent to the heating zone, the heating zone being operative to elevate a temperature of the electronic components and the cooling zone being operative to lower a temperature of the electronic components to an ambient temperature.

11. A handling system for testing electronic components, comprising:
an onloading station;
a carrier system which is positionable next to the onloading station, the carrier system being configured to carry electronic components transferred from the onloading station, wherein the carrier system comprises a first buffer carrier for carrying a first array of a first plurality of electronic components and a second buffer carrier for carrying a second array of a second plurality of electronic components;
a testing station which is configured for receiving the carrier system;
and is configured to simultaneously test the first array of the first plurality of electronic components which have been arranged on the first buffer carrier of the carrier system while the second buffer carrier stands by at the testing station, the second buffer carrier proceeding for testing of the second array of the second plurality of electronic components at the testing station after the testing station completes testing of the first array of the first plurality of electronic components on the first buffer carrier;
a rotary turret; and
pick heads mounted on the rotary turret, each pick head being configured to hold a respective electronic component provided by the carrier system;
wherein the pick heads are operative to remove electronic components from the first buffer carrier and the second buffer carrier after testing the same at the testing station;
wherein the first array of the first plurality of electronic components are held by a first plurality of pick heads and the second array of the second plurality of electronic components are held by a second plurality of pick heads;
wherein each of the first buffer carrier and the second buffer carrier is movable from a position of the rotary turret to a position of the testing station; and
wherein each of the first buffer carrier and the second buffer carrier is movable at the same time from the position of the rotary turret to the position of the testing station.

12. The handling system as claimed in claim 11, further comprising a singulation system connected to the onloading station for providing singulated electronic components to the carrier system.

13. A method for testing electronic components, comprising the steps of:
- providing electronic components from a supply source to pick heads mounted on a rotary turret, each pick head being configured to hold a respective electronic component;
- transferring a plurality of electronic components from the pick heads to a carrier system positioned adjacent to the rotary turret, wherein the carrier system comprises a first buffer carrier for carrying a first array of a first plurality of electronic components and a second buffer carrier for carrying a second array of a second plurality of electronic components;
- moving the first buffer carrier of the carrier system to a testing station for simultaneously testing the first array of the first plurality of electronic components which have been arranged on the first buffer carrier of the carrier system;
- testing the first array of the first plurality of electronic components on the first buffer carrier while the second buffer carrier stands by at the testing station, the second buffer carrier proceeding for testing of the second array of the second plurality of electronic components at the testing station after the testing station completes testing of the first array of the first plurality of electronic components on the first buffer carrier; and
- after testing the electronic components, removing the plurality of electronic components from the first buffer carrier and the second buffer carrier with the pick heads,
- wherein each of the first buffer carrier and the second buffer carrier is movable from a position of the rotary turret to a position of the testing station;
- wherein the first array of the first plurality of electronic components are held by a first plurality of pick heads and the second array of the second plurality of electronic components are held by a second plurality of pick heads; and
- wherein each of the first buffer carrier and the second buffer carrier is movable at the same time from the position of the rotary turret to the position of the testing station.

14. The method for testing electronic components as claimed in claim 13, further comprising holding and conveying the carrier system between the rotary turret and the testing station linearly using linear arms.

15. The method for testing electronic components as claimed in claim 13, further comprising holding and conveying the carrier system with a rotary arm that is configured to simultaneously hold and convey a plurality of buffer carriers comprised in the carrier system, such that the plurality of buffer carriers are equally spaced around the rotary arm.

16. The method for testing electronic components as claimed in claim 13, further comprising the step of transferring the electronic components which have been removed from the carrier system with the pick heads to an offloading station located adjacent to the rotary turret.

17. The method for testing electronic components as claimed in claim 13, wherein the first plurality of electronic components arranged on the first buffer carrier are tested at the testing station while electronic components are transferred by the pick heads to the second buffer carrier adjacent to the rotary turret.

18. The method for testing electronic components as claimed in claim 13, further comprising the step of bringing the electronic components to a desired temperature prior to testing the electronic components at the testing station by conveying the electronic components through a temperature control zone.

19. The method for testing electronic components as claimed in claim 18, wherein the temperature control zone further comprises a heating zone and a separate cooling zone adjacent to the heating zone, the heating zone being operative to elevate a temperature of the electronic components and the cooling zone being operative to lower a temperature of the electronic components to an ambient temperature.

* * * * *